United States Patent
Huang

(10) Patent No.: US 8,749,264 B2
(45) Date of Patent: Jun. 10, 2014

(54) CIRCUIT FOR TESTING MOTHERBOARD

(75) Inventor: Fa-Sheng Huang, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 114 days.

(21) Appl. No.: 13/535,520

(22) Filed: Jun. 28, 2012

(65) Prior Publication Data

US 2013/0234776 A1 Sep. 12, 2013

(30) Foreign Application Priority Data

Mar. 7, 2012 (CN) .......................... 2012 1 0058076

(51) Int. Cl.
 *G01R 31/28* (2006.01)
(52) U.S. Cl.
 CPC ....................................... *G01R 31/28* (2013.01)
 USPC ........................ 324/763.01; 327/365; 327/308
(58) Field of Classification Search
 CPC ................ G01R 31/28; G01R 31/304–31/306; G01R 31/309; H03K 17/00
 USPC ............................... 324/763.01; 327/308, 365
 See application file for complete search history.

(56) References Cited

U.S. PATENT DOCUMENTS

| | | | | |
|---|---|---|---|---|
| 4,771,230 A | * | 9/1988 | Zeh ................................ | 324/459 |
| 5,543,754 A | * | 8/1996 | Onodera ......................... | 331/25 |
| 7,750,716 B2 | * | 7/2010 | Hosoya ......................... | 327/308 |

FOREIGN PATENT DOCUMENTS

CN 201804269 U 4/2011

* cited by examiner

*Primary Examiner* — Arleen M Vazquez
*Assistant Examiner* — Neel Shah
(74) *Attorney, Agent, or Firm* — Novak Druce Connolly Bove + Quigg LLP

(57) ABSTRACT

A circuit includes first to third nodes, resistors with different resistance, capacitors with different capacitance, first switches corresponding to the same number of resistors, second switches corresponding to the same number of capacitors, and a third switch. A first terminal of each resistor is connected to the first node. A second terminal of each resistor is connected to a first terminal of a corresponding one first switch, a second terminal of each first switch is connected to the second node. A first terminal of the third switch is connected to the second terminal of each first switch. A second terminal of the third switch is connected to a first terminal of each capacitor. A second terminal of each capacitor is connected to a first terminal of a corresponding one second switch. A second terminal of each second switch is connected to the third node.

1 Claim, 1 Drawing Sheet

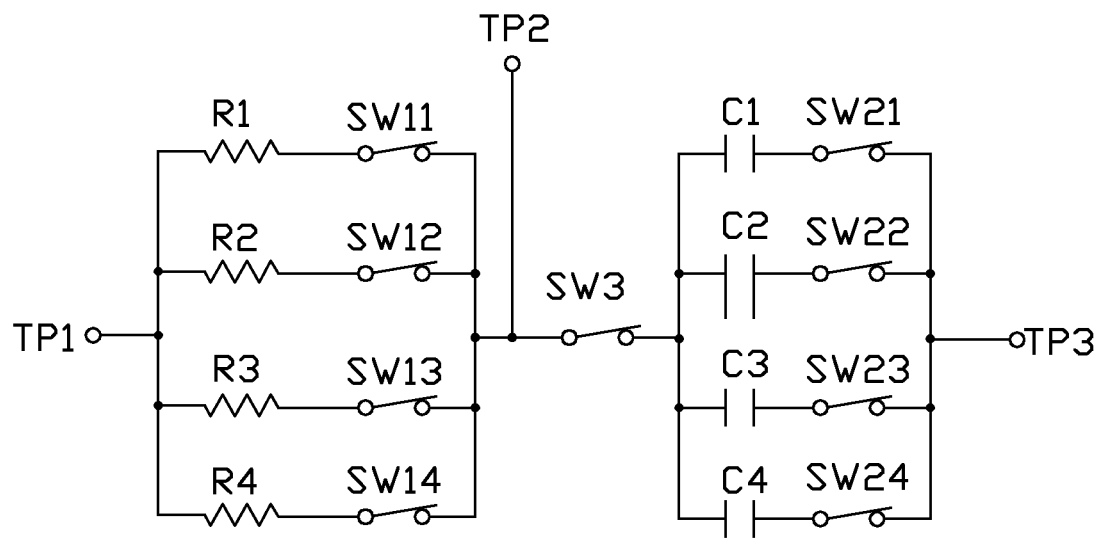

CIRCUIT FOR TESTING MOTHERBOARD

BACKGROUND

1. Technical Field

The present disclosure relates to a circuit used for testing motherboards.

2. Description of Related Art

When testing motherboards, designers need to use more than one resistor or capacitor in their testing circuitry. However, swapping out these test resistors and capacitors again and again are tedious and inconvenient. Therefore, there is room for improvement in the art.

BRIEF DESCRIPTION OF THE DRAWING

Many aspects of the embodiments can be better understood with reference to the following drawing. The components in the drawing are not necessarily drawn to scale, the emphasis instead being placed upon clearly illustrating the principles of the present embodiments. Moreover, in the drawing, like reference numerals designate corresponding parts throughout the several views.

The FIGURE is a circuit diagram of an exemplary embodiment of a circuit for testing a motherboard.

DETAILED DESCRIPTION

The disclosure, including the accompanying drawing, is illustrated by way of examples and not by way of limitation. It should be noted that references to "an" or "one" embodiment in this disclosure are not necessarily to the same embodiment, and such references mean at least one.

The FIGURE is an exemplary embodiment of a circuit used for testing a motherboard. The circuit includes a plurality of resistors with different resistance, a plurality of capacitors with different capacitance, a plurality of first switches, a plurality of second switches, a third switch SW3, a first node TP1, a second node TP2, and a third node TP3. In the embodiment, the circuit includes four resistors R1-R4, four capacitors C1-C4, four first switches SW11-SW14, and four second switches SW21-SW24.

First terminals of the resistors R1-R4 are connected to the first node TP1. Second terminals of the resistors R1-R4 are respectively connected to first terminals of the first switches SW11-SW14. Second terminals of the first switches SW11-SW14 are connected to the second node TP2. The second terminals of the first switches SW11-SW14 are all connected to a first terminal of the third switch SW3. A second terminal of the third switch SW3 is connected to first terminals of the capacitors C1-C4. Second terminals of the capacitors C1-C4 are respectively connected to first terminals of the second switches SW21-SW24. Second terminals of the second switches SW21-SW24 are all connected to the third node TP3.

In use, when it is needed to connect a resistor to the motherboard for testing the motherboard, the third switch SW3 is turned off. The first node TP1 and the second node TP2 are respectively connected to two terminals which should be connected to the resistor, and the third node TP3 is idle. Thus, when the first switch SW11 is turned on, and the first switches SW12-SW14 are turned off, the resistor R1 is connected to the motherboard. When the first switch SW12 is turned on, and the first switches SW11, SW13, and SW14 are turned off, the resistor R2 is connected to the motherboard. When the first switch SW13 is turned on, and the first switches SW11, SW12, and SW14 are turned off, the resistor R3 is connected to the motherboard. When the first switch SW14 is turned on, and the first switches SW11-SW13 are turned off, the resistor R4 is connected to the motherboard.

When it is needed to connect a capacitor to the motherboard for testing the motherboard, the third switch SW3 is turned on. The first node TP1 is idle, the second node TP2 and the third node TP3 are respectively connected to two terminals which should be connected to the capacitor. Thus, when the second switch SW21 is turned on, and the second switches SW22-SW24 are turned off, the capacitor C1 is connected to the motherboard. When the second switch SW22 is turned on, and the second switches SW21, SW23, and SW24 are turned off, the capacitor C2 is connected to the motherboard. When the second switch SW23 is turned on, and the second switches SW21, SW22, and SW24 are turned off, the capacitor C3 is connected to the motherboard. When the second switch SW24 is turned on, and the second switches SW21-SW23 are turned off, the capacitor C4 is connected to the motherboard.

When it is needed to connect a RC (resistor and capacitor) circuit to the motherboard for testing the motherboard, the third switch SW3 is turned on. The first node TP1 and the second node TP2 are respectively connected to two terminals which should be connected to the RC circuit, and the third node TP3 is grounded. Thus, when the first switch SW11 is turned on, the first switches SW12-SW14 are turned off, the second switch SW21 is turned on, and the second switches SW22-SW24 are turned off, the RC circuit including the resistor R1 and the capacitor C1 is connected to the motherboard. When the first switch SW12 is turned on, the first switches SW11, SW13, and SW14 are turned off, the second switch SW22 is turned on, and the second switches SW21, SW23, and SW24 are turned off, the RC circuit including the resistor R2 and the capacitor C2 is connected to the motherboard. When the first switch SW13 is turned on, the first switches SW11, SW12, and SW14 are turned off, the second switch SW23 is turned on, and the second switches SW21, SW22, and SW24 are turned off, the RC circuit including the resistor R3 and the capacitor C3 is connected to the motherboard. When the first switch SW14 is turned on, the first switches SW11-SW13 are turned off, the second switch SW24 is turned on, and the second switches SW21-SW23 are turned off, the RC circuit including the resistor R4 and the capacitor C4 is connected to the motherboard.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A circuit, comprising:
   a first node;
   a second node;
   a third node;

a plurality of resistors with different resistance, wherein a first terminal of each resistor is connected to the first node a plurality of capacitors with different capacitance;

a plurality of first switches corresponding to the same number of resistors, wherein a second terminal of each resistor is connected to a first terminal of a corresponding one of the first switches, a second terminal of each first switch is connected to the second node;

a plurality of second switches corresponding to the same number of capacitors; and a third switch, wherein a first terminal of the third switch is connected to the second terminal of each first switch, a second terminal of the third switch is connected to a first terminal of each capacitor, a second terminal of each capacitor is connected to a first terminal of a corresponding one of the second switches, a second terminal of each second switch is connected to the third node.

* * * * *